United States Patent [19]
Fuchida et al.

[11] Patent Number: 5,723,908
[45] Date of Patent: Mar. 3, 1998

[54] MULTILAYER WIRING STRUCTURE

[75] Inventors: Yumi Fuchida, Yokohama; Jun Hanari; Kazuhiro Matsumoto, both of Kawasaki; Junichi Kudo, Yokohama; Kunio Yoshihara, Kawasaki; Ayako Takagi, Yokosuka, all of Japan

[73] Assignee: Kabushiki Kaisha Toshiba, Kawasaki, Japan

[21] Appl. No.: 208,870

[22] Filed: Mar. 11, 1994

[30] Foreign Application Priority Data

Mar. 11, 1993 [JP] Japan ................ 5-051118

[51] Int. Cl.[6] .......................... H01L 23/48
[52] U.S. Cl. .............. 257/758; 257/211; 257/773; 257/776
[58] Field of Search ................ 257/758, 211, 257/776, 773, 315

[56] References Cited

U.S. PATENT DOCUMENTS

| | | | |
|---|---|---|---|
| 4,857,987 | 8/1989 | Ogura et al. | 257/758 |
| 4,866,507 | 9/1989 | Jacobs et al. | |
| 4,924,290 | 5/1990 | Enkaku et al. | 257/758 |
| 5,095,352 | 3/1992 | Noda et al. | 257/211 |
| 5,103,288 | 4/1992 | Sakamoto et al. | 257/758 |
| 5,119,170 | 6/1992 | Iwamatsu | |
| 5,136,358 | 8/1992 | Sakai et al. | |
| 5,148,263 | 9/1992 | Hamai | 257/758 |
| 5,185,650 | 2/1993 | Wakimoto et al. | |
| 5,406,118 | 4/1995 | Saito | 257/758 |

FOREIGN PATENT DOCUMENTS

| | | | |
|---|---|---|---|
| 0 026 807 | 4/1981 | European Pat. Off. | |
| 0 308 714 | 3/1989 | European Pat. Off. | |
| 0 374 842 | 6/1990 | European Pat. Off. | |
| 0 378 211 | 7/1990 | European Pat. Off. | |
| 473144 | 3/1992 | European Pat. Off. | 257/758 |
| 1-196198 | 8/1989 | Japan | |
| 3-67357 | 10/1991 | Japan | |
| 4 245 456 | 9/1992 | Japan | |

*Primary Examiner*—Tom Thomas
*Assistant Examiner*—Roy Potter
*Attorney, Agent, or Firm*—Oblon, Spivak, McClelland, Maier & Neustadt, P.C.

[57] ABSTRACT

A multilayer wiring structure comprising a substrate, two line layers, and an interlayer insulating film. The first line layer consists of strip-shaped power/ground lines which extend parallel to one another. The second line layer is located above or below the first line layer, extends substantially parallel to the first line layer. The second line layer consists of strip-shaped signal lines which extend parallel to one another and at an angle to the strip-shaped power/ground lines of the first line layer in a skewed position.

18 Claims, 11 Drawing Sheets

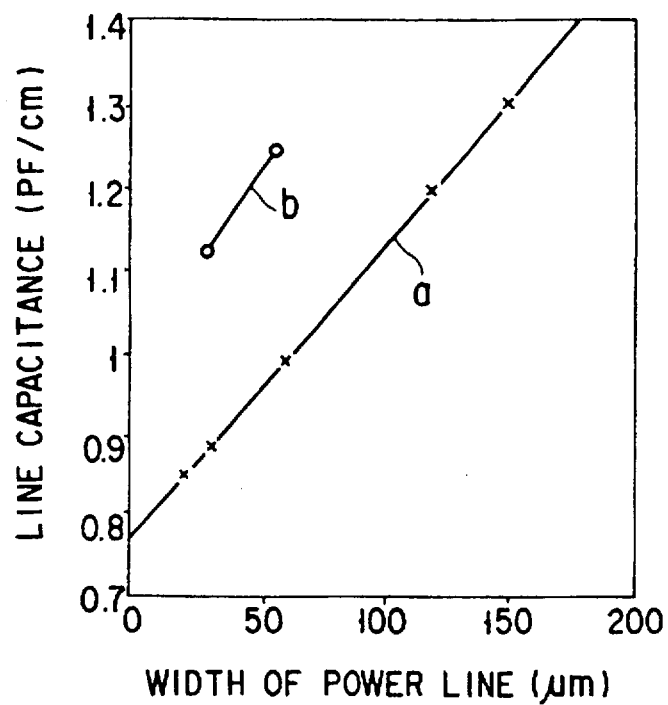
F I G. 5

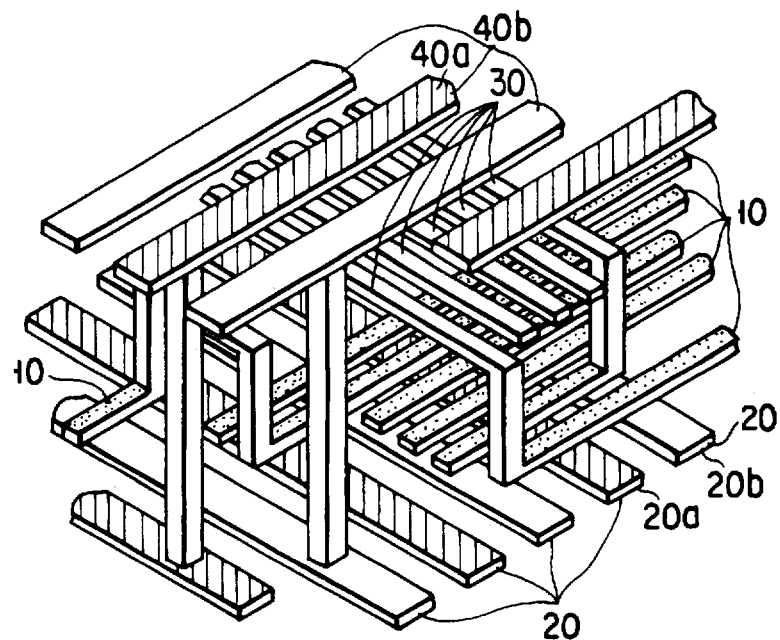
F I G. 9
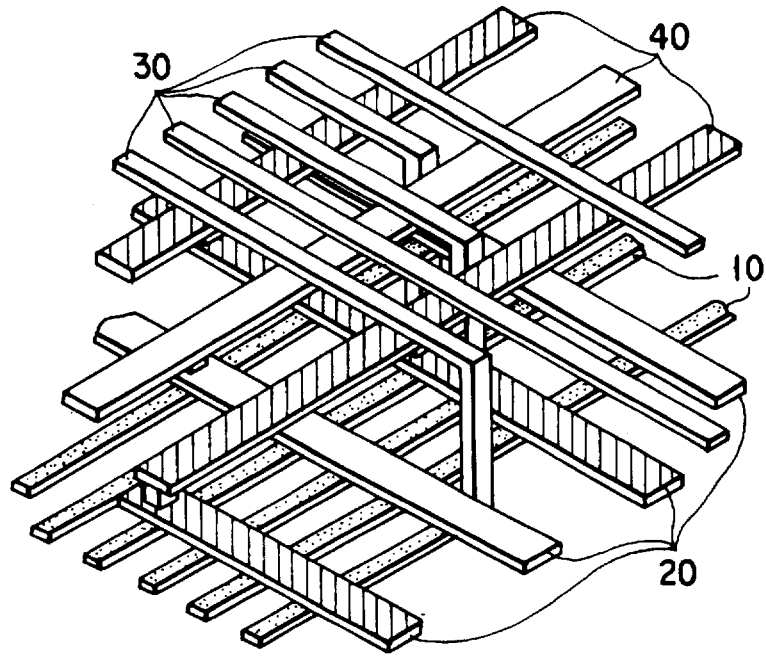
F I G. 10

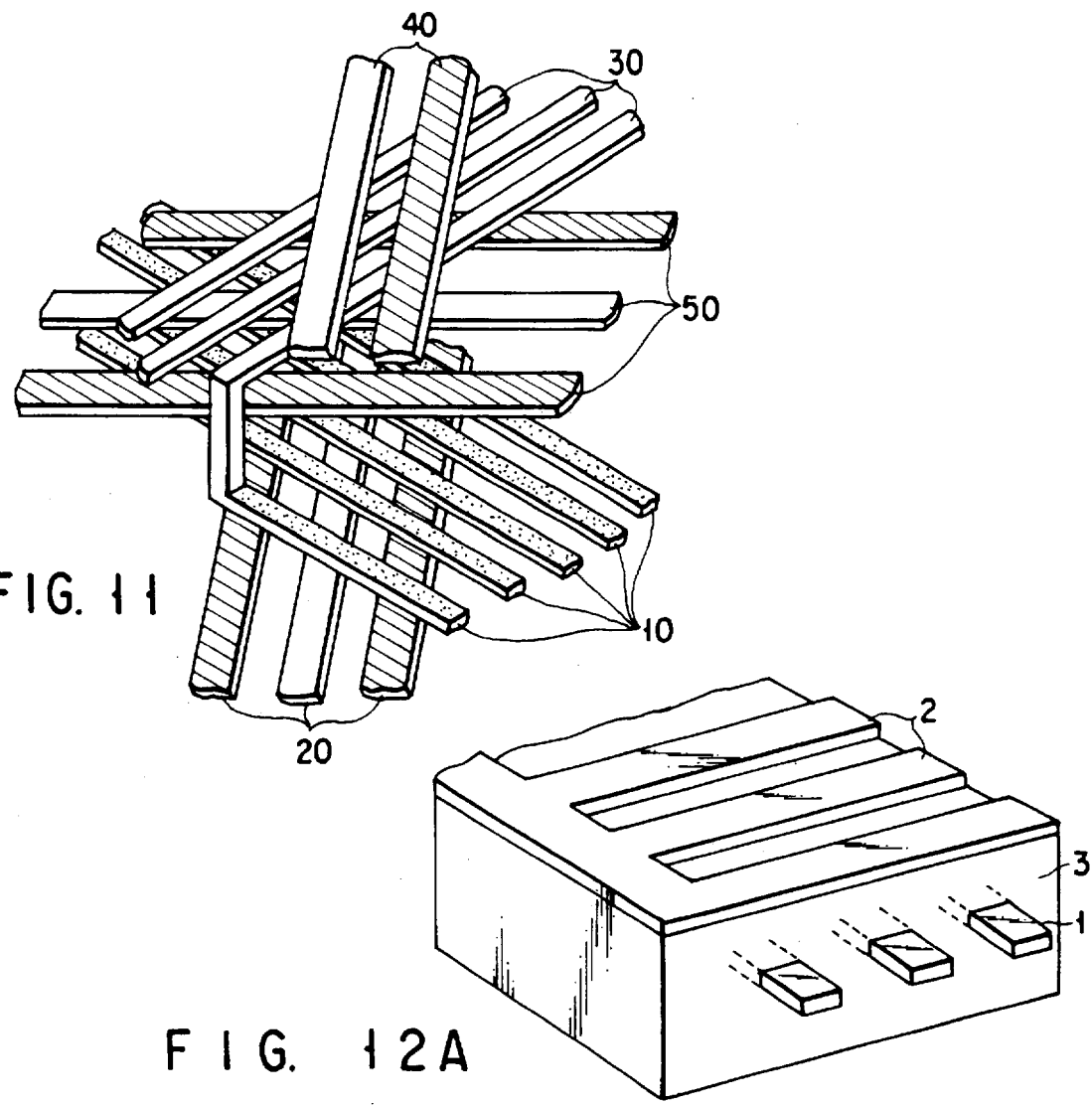
FIG. 11
FIG. 12A
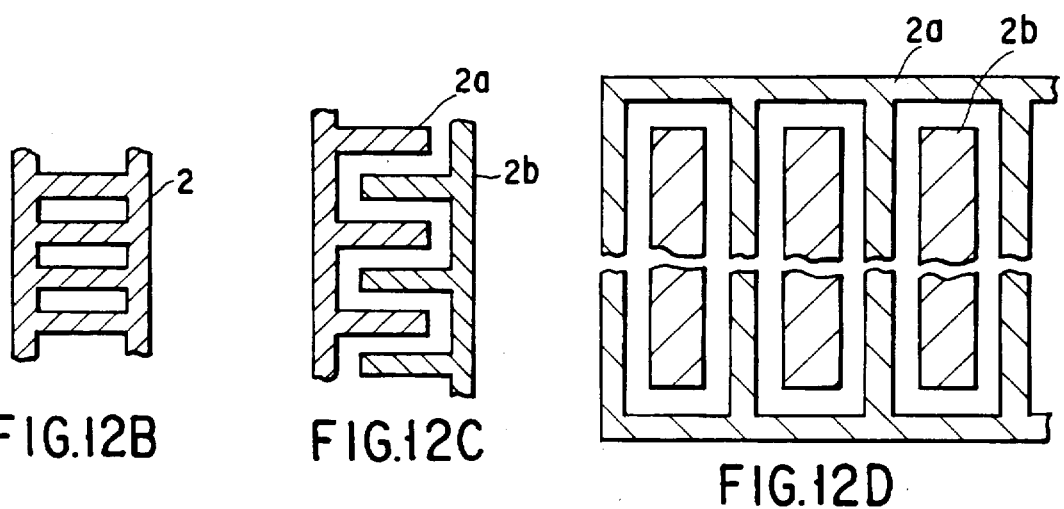
FIG. 12B
FIG. 12C
FIG. 12D

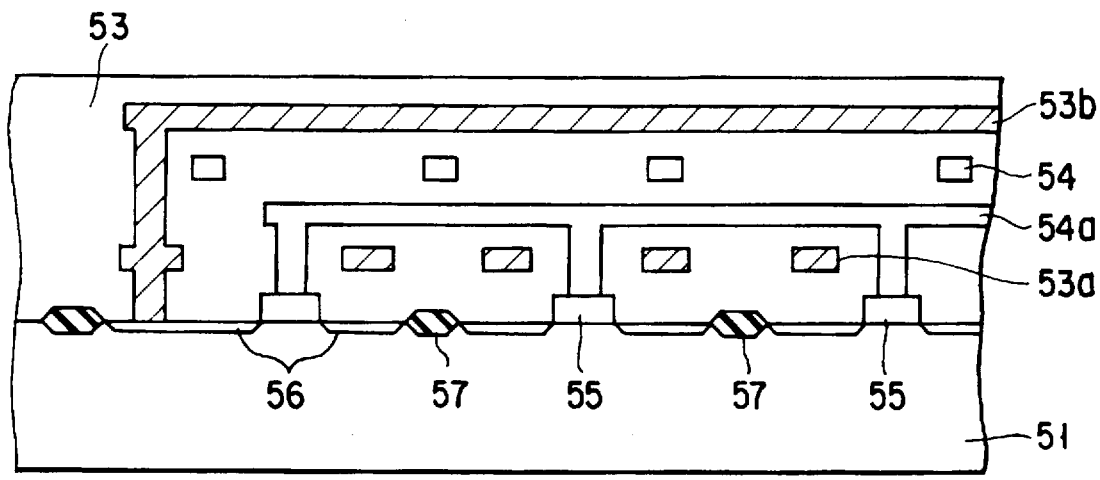
F I G. 23
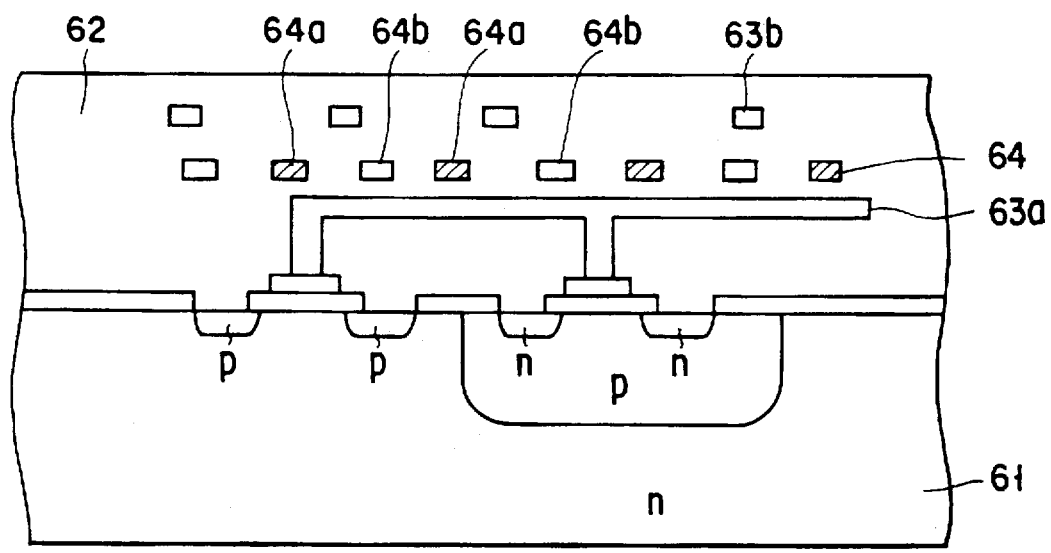
F I G. 24

MULTILAYER WIRING STRUCTURE

BACKGROUND OF THE INVENTION

1. Field of the Invention

The present invention relates to a multilayer wiring structure, and more particularly to improvement of a multilayer wiring structure for connecting high-speed circuit elements.

2. Description of the Related Art

In recent years, it has been increasingly demanded that the performance of general-purpose computers be enhanced to cope with the advancing information technology. To increase the performance of the computers it is necessary to shorten the clock cycle of the computers. To this end, it would be important not only to arrange the circuit elements in a higher packing density, but also to reduce the signal transfer delay in the lines connecting the circuit elements. Hence there is a demand for a wiring structure in which lines are short and arranged in high packing density, and which enables the computers to operate at high speed and with high reliability.

A printed circuit board, a thick film multilayer wiring board, or a thin film multilayer wiring board, for use in a high-performance, general-purpose computer, may assume either a strip line structure or a micro-strip line structure. As shown in FIG. 1, the strip line structure comprises a signal-line layer 1, ground-line layers 2, and a insulating layer 3. The signal-line layer is embedded in the insulating layer 3. The ground-line layers 2 are formed on the major surfaces of the layer 3, respectively. On the other hand, the micro-strip line structure comprises an insulating layer, a signal-line layer embedded in the insulating layer, and a signal-line layer formed on one of the major surfaces of the insulating layer.

With either type of a strip line structure it is easy to obtain matching of the characteristic impedance of the signal-line layer merely by changing the material of the insulating layer or the distance between the signal-line layer and the power-line layer. Therefore, both types of strip line structures are widely employed as a wiring structure for high-frequency. Recently, circuit elements have acquired an increased operating speed. The signal transfer delay in a strip line structure of either type can no longer be neglected and must be reduced as much as possible.

Various methods have hitherto been applied to minimize the signal transfer delay in multilayer wiring structures. One method is to space the signal-line layer and the ground-line layer apart from each other by a longer distance. Another method is, as shown in FIG. 2, to shape the ground-line layer 2 and the power-line layer 4 in the form of a net, thereby to decrease the capacitance of the layer 2 opposing the signal-line layer 1 or the power-line layer 4.

The strip line structures shown in FIGS. 1 and 2 are, however, disadvantageous in some respects. First, if two or more power/ground lines (i.e., power lines and ground lines) are arranged in the same layer, the portions of the power lines or ground lines at different potentials become an irregular pattern. Second, if power/ground lines are to extend at 45° to signal lines to constitute a net-like ground-line layer, a great amount of CAD data will be required to design that net-like ground-line structure. (Particularly, an enormous amount of CAD data needs to be applied to design an large wiring substrate such as an MCM substrate.) Third, in order to achieve impedance matching of the signal lines of the strip line structure of FIG. 2 which has a net-like ground-line layer, three-dimensional analysis must be performed, which involves complex calculations.

A multilayer wiring structure is known, as is disclosed in U.S. Pat. No. 4,866,507, in which the lines in a layer extend at 90° to those in an adjacent layer. This multilayer wiring structure is designed to accomplish signal transfer of co-planar type. In this structure, some power lines are arranged in one layer at right angles to the other power lines arranged in another layer. Since the signal lines and the power/ground lines are formed in the same layer, there is inevitably a large coupling capacitance between each signal line and each power line. If the layers of the wiring structure are spaced apart by a relatively long distance, or if the ground-line layer and the power-line layer are shaped like a net, the wiring capacitance cannot not be decreased. In this case, the signal transfer delay in the multilayer wiring structure cannot be as short as is desired.

As described above, the conventional strip line structures are disadvantageous in that the coupling capacitance between the power-line layer and the signal-line layer is large, and that the signal transfer delay cannot be effectively reduced if the layers of the wiring structure are spaced apart by a relatively long distance or if the ground-line layer and the power-line layer are shaped like a net, the wiring capacitance cannot be decreased.

The conventional strip line structures are also disadvantageous in the following respect. As described above, the signal lines and the power/ground lines are formed at the same level. This results in various problems. First, the capacitance of each signal line cannot be decreased. Second, many limitations are imposed on the designing of the power lines. Third, the power-supplying points are remote from one another, making it difficult to reduce the impedance of the power lines.

SUMMARY OF THE INVENTION

An object of the present invention is to provide a multilayer wiring structure which enable a device to operate at high speed and has a high packing density and high reliability.

Another object of the invention is to provide a semiconductor device comprising a multilayer wiring structure which enable the device to operate at high speed and has a high packing density and high reliability.

According to a first aspect of this invention, there is provided a multilayer wiring structure comprising: a substrate; a first line layer including strip-shaped power and/or ground line(s) extending in a first direction; a second line layer located above or below the first line layer and including a strip-shaped signal line extending in a second direction; and an interlayer insulating layer interposed between the first line layer and the second line layer, the first direction being in a skewed position with respect to the second direction.

According to a second aspect of the present invention, there is provided a multilayer wiring structure comprising: a substrate; a first line layer including strip-shaped power and/or ground line(s) extending in a first direction; a second line layer located above or below the first line layer and including a strip-shaped signal line extending in a second direction; and an interlayer insulating layer interposed between the first line layer and the second line layer, the first direction being in parallel with the second direction.

According to a third aspect of the invention, there is provided a semiconductor device comprising: a semiconductor substrate having a major surface; a semiconductor element formed in the major surface of the semiconductor substrate; a multilayer wiring structure located above the semiconductor element; and a first interlayer insulating layer interposed between the semiconductor element and the multilayer wiring structure. The multilayer wiring structure comprises: a first line layer including strip-shaped power and/or ground line(s) extending in a first direction; a second line layer located above or below the first line layer and including a strip-shaped signal line extending in a second direction; and a second interlayer insulating layer interposed between the first line layer and the second line layer, the first direction being in a skewed position with respect to the second direction.

According to a fourth aspect of the present invention, there is provided a semiconductor device comprising: a semiconductor substrate having a major surface; a semiconductor element formed in the major surface of the semiconductor substrate; a multilayer wiring structure located above the semiconductor element; and a first interlayer insulating film interposed between the semiconductor element and the multilayer wiring structure. The multilayer wiring structure comprises: a substrate; a first line layer including strip-shaped power and/or ground line(s) extending in a first direction; a second line layer located above or below the first line layer and including a strip-shaped signal line extending in a second direction; and a second interlayer insulating layer interposed between the first line layer and the second line layer, the first direction being in parallel with the second direction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

Accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a graph representing the relationships between the width of each power/ground line and the capacitance of each signal line, which are observed in a conventional multilayer wiring structure and the structure according to the first embodiment of the invention;

FIG. 9 is a perspective view of a multilayer wiring structure according to a third embodiment of the present invention;

FIG. 10 is a perspective view of a multilayer wiring structure according to a fourth embodiment of the invention;

FIG. 11 is a perspective view of a multilayer wiring structure according to a fifth embodiment of the present invention;

FIGS. 12A to 12D are views illustrating some modifications of the structure according to the first embodiment of the invention;

FIGS. 23 and 24 are cross-sectional views showing LSI devices, each incorporating the multilayer wiring structure of the present invention.

DETAILED DESCRIPTION OF THE PREFERRED EMBODIMENTS

Various embodiments of the present invention will now be described, with reference to the accompanying drawings.

Figure 3:
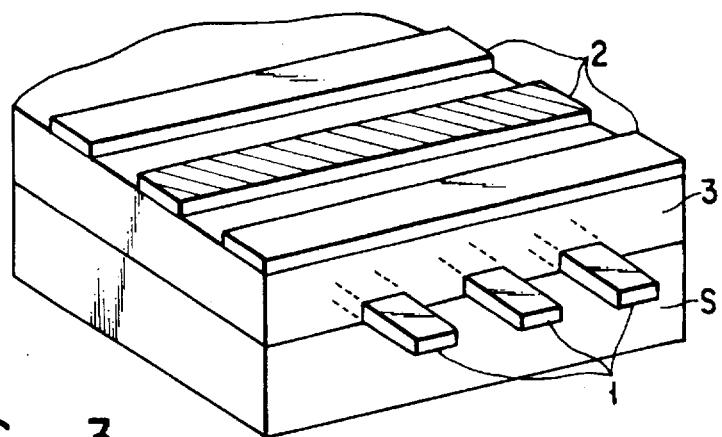
FIG. 3 is a perspective view showing a part of a multilayer wiring structure according to a first embodiment of the present invention.
Figure 4A:
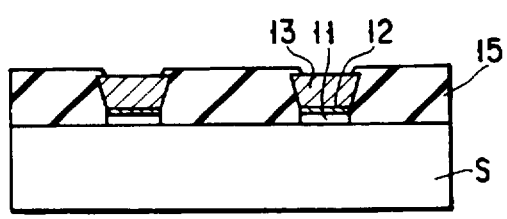
FIGS. 4A and 4B are sectional views explaining the steps of manufacturing the structure according to the first embodiment of the invention.
Figure 4B:
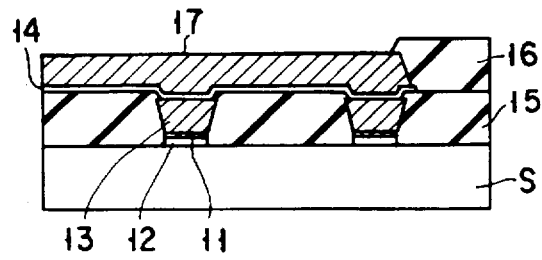

FIG. 3 is a perspective view of a multilayer wiring structure according to an embodiment of the present invention. FIGS. 4A and 4B are cross-sectional views, explaining two of the steps of manufacturing the multi-layer wiring structure shown in FIG. 3.

As is shown in FIG. 3, the multilayer wiring structure comprises a substrate S, signal lines 1 formed on the substrate S, an interlayer insulating film 3 formed on the substrate S and covering the signal lines 1, and power/ground lines 2 formed on the insulating film 3. The substrate S is made of either semiconductor material such as silicon or ceramic such as alumina or aluminum nitride. The signal lines 1 are parallel metal strips. The interlayer insulating film 3 is made of organic insulating material such as polyimide or inorganic insulating material such as silicon oxide. The power/ground lines 2 are parallel metal pattern strips which extend at right angles to the signal lines 1.

In the case where the substrate S is made of aluminum nitride, the multilayer wiring structure is manufactured as follows. First, a wiring pattern 11 (i.e., the first line layer) is formed on the aluminum nitride substrate S. To be more specific, a thin titanium film is formed on the substrate S by means of sputtering, and a thin aluminum film is formed on the titanium film by sputtering, too. A resist pattern is formed on the aluminum film. Using the resist pattern as a mask, selective etching is performed on both the titanium film and the aluminum film, thereby forming a wiring pattern 11 as shown in FIG. 4A.

Next, titanium and copper are vapor-deposited on the wiring pattern 11, thus forming a vapor-deposited film 12. A resist is coated on the film 12 and subsequently patterned into a resist pattern. Those portions of the film 12 which are exposed through the resist pattern are plated with copper and nickel, thereby forming a via pattern 13 for connecting the wiring pattern 11 (i.e., the first line layer) to the second line layer 17 (later described). After removing the resist pattern from the via pattern 13, polyimide is spin-coated on the entire surface of the resultant structure and then cured in an oven. An interlayer insulating film 15 is thereby formed as shown in FIG. 4A.

Thereafter, titanium and copper are vapor-deposited on the interlayer insulating film 15, thus forming a vapor-deposited film 14 in the same way as in the process of forming the via pattern 13. A resist is coated on the film 14 and subsequently patterned into a resist pattern. Those portions of the film 14 which are exposed through this resist pattern are plated with copper and nickel, thereby forming the second line layer 17 as illustrated in FIG. 4B. The resist pattern is removed from the second line layer 17. Then, polyimide is spin-coated on the entire surface of the resultant structure, cured in an oven, and then patterned. An interlayer insulating film 16 is thereby formed as shown in FIG. 4B.

Other line layers can be formed by carrying out the processes described with reference to FIGS. 4A and 4B. As stated above, the wiring pattern 11, i.e., the first line layer, is made by performing selective etching on thin metal films. Instead it may be formed of a plated layer. Furthermore, the methods of forming the line layers and the insulating films are not limited to those which have been explained with reference to FIGS. 4A and 4B. Rather, the line layers and the insulating films can be formed by any other methods selected in accordance with the type of the substrate used, the apparatus employed to form them, and the desired characteristics of the multilayer wiring structure.

To reduce the capacitance of signal line, the relationship of $W_{pg} \leq S_{pg}$ is preferable, where $W_{pg}$ is the width of each power/ground line, and $S_{pg}$ is the intervals at which the power/ground lines are spaced apart. To increase the tolerable value for the current flowing in each power/ground line so as to decrease the inductance thereof, the width $W_s$ of each signal line and the width $W_{pg}$ of each power/ground line should have the relationship of: $W_s \leq W_{pg}$. The width $W_s$ of each signal line and the width $W_{pg}$ of each power/ground line should have the relationship of:

$$0.25 \leq W_{pg}/(W_{pg}+S_{pg}) \leq 0.75.$$

In the multilayer wiring structure is one designed to transfer high-frequency signals, it is desirable that their via pitch be 1/10 or less of the wavelength of the signals. If the via pitch is of this value, high-frequency signals is prevented from inducing in the power/ground lines, and thus crosstalk or deterioration of signals is not caused.

Line a in FIG. 5 illustrates the width-capacitance relationship of each power/ground line 2, which was determined with wiring structures of the type shown in FIG. 3. The interlayer insulating films 3 had a thickness of 15 μm and a dielectric constant of 3.5. Line b in FIG. 5 represents the the width-capacitance relationship of each line of the ground-line layer 2 or the power-line layer 4, which was determined with conventional wiring structures of the type shown in FIG. 2. The conventional structures had been made for comparison with those of FIG. 3. The signal lines 1 extended at 45° to the lines of the net-shaped layers 2 and 4.

Figure 1:
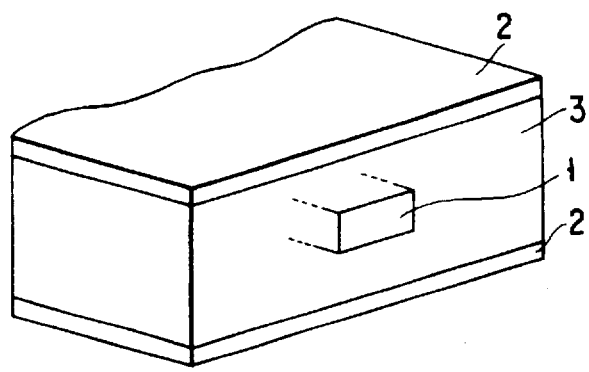
FIG. 1 is a perspective view showing a part of a conventional multilayer wiring structure.
Figure 2:
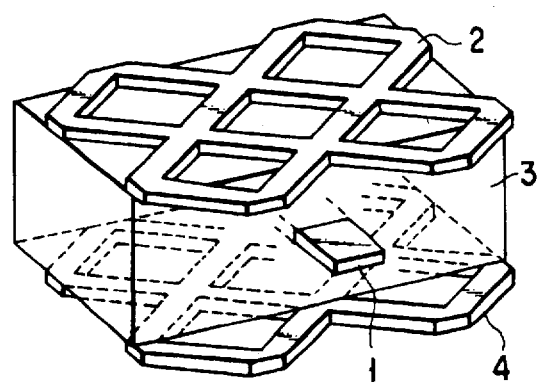
FIG. 2 is a perspective view of another conventional multilayer wiring structure.
Figures 6A, 6B:
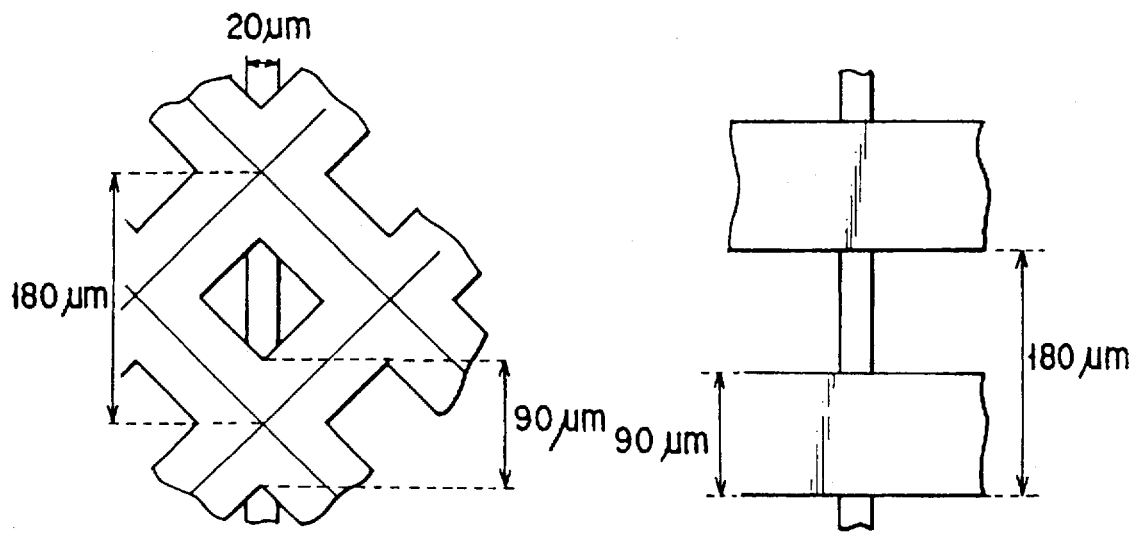
FIG. 6A is a plan view of a line layer of a conventional multilayer wiring structure.
FIG. 6B is a plan view of a line layer of the structure according to the first embodiment of the invention.

FIG. 6A is a plan view of the structure of FIG. 2, showing the positional relationship between a signal line 1 and the net-shaped ground-line layer 2. FIG. 6B is a plan view of the structure of FIG. 3, illustrating the positional relationship between a signal line and the power/ground lines. FIGS. 6A and 6B have been prepared on the assumption that no other signal lines are located near the single signal line. As is evident from FIGS. 6A and 6B, the capacitance of each signal line incorporated in the structure of this invention can be far smaller than that of each signal line used in the conventional structure (FIG. 2) and having the same width. It is also obvious that the power/ground lines can have a width greater than that of the power/ground lines incorporated in the multilayer wiring structure of FIG. 2. Hence, not only can the power/ground lines be formed easily, but also can the capacity of the current flowing in each power/ground line be increased.

Figure 7:
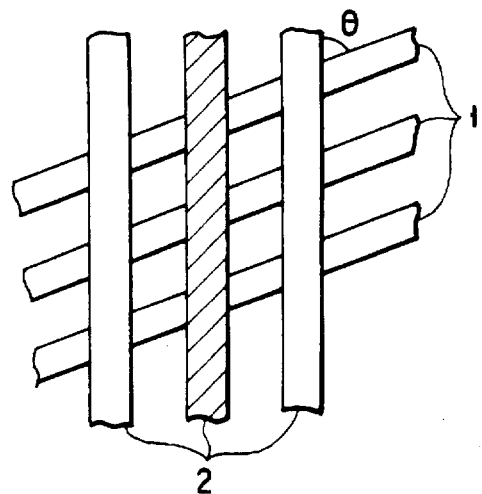
FIG. 7 is a plan view showing a modification of the wiring structure according to the first embodiment of this invention.

In the embodiment shown in FIG. 3, the signal lines 1 extend at right angles to the power/ground lines 2. Nonetheless, as shown in FIG. 7, the signal lines 1 may be formed, extending at an particular angle θ to the power/ground lines 2. This specific positional relationship between the signal lines 1 and the power/ground lines 2 is desirable if the wiring structure has three or more line layers; the line layers can be distinguished and the wiring structure can be designed, more easily than otherwise. The angle θ should be 90°/n, where n is an integer. Preferably, the angle θ is 45° or 90°.

As described above, the signal lines 1 are skew lines with respect to the power/ground lines in the first embodiment of the invention. Therefore, the area over which each signal line 1 overlaps any one of the power/ground lines 2 is smaller than otherwise. This serves to greatly reduce the coupling capacitance between the signal-line layer and the power/ground line layer.

Less limitations are imposed on the designing of the power lines than in the conventional multilayer wiring structure. Power-supply potentials or ground potentials of desirable values can easily be applied at any desirable portions of the power/ground lines 2, without much affecting the signal-transfer characteristic of the signal lines 1.

A multilayer wiring structure, which is the second embodiment of the present invention, will now be described with reference to FIGS. 8A and 8B. The second embodiment is characterized in that power/ground lines 20 are located between first signal lines 10, on one hand, second signal lines 30, on the other hand.

Figure 8A:
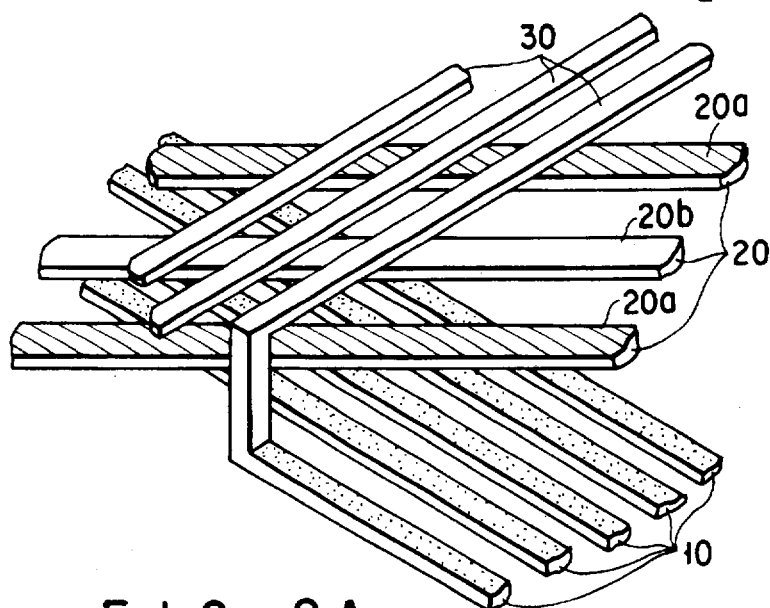
FIGS. 8A and 8B are a perspective view and a plan view, respectively, both showing a multilayer wiring structure according to a second embodiment of this invention.
Figure 8B:
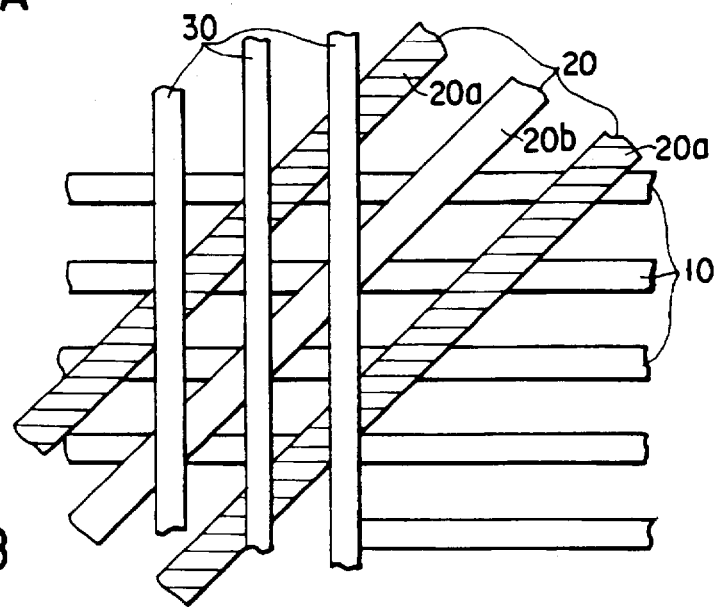

FIG. 8A is a perspective view of the multilayer wiring structure according to the second embodiment, and FIG. 8B is a plan view of this multilayer wiring structure. As shown in FIGS. 8A and 8B, the first signal lines 10 are parallel strips arranged in a first plane, and the second signal lines 30 are parallel strips arranged in a second plane parallel to the first plane. The second signal lines 30 extend at right angels to the first signal lines 10 in a skewed position. The power/ground lines 20, which are parallel strips, are located between the first and second planes and extend at 45° to the signal lines 10 and 30 in a skewed position. The power/ground lines 20 are a combination of ground lines 20a and power lines 20b, which are arranged alternately.

The structure of FIGS. 8A and 8B further comprises two interlayer insulating films (not shown). The first insulating film is interposed between the first signal lines 10, on one hand, and the power/ground lines 20, on the other. The second insulating film is interposed between the power/ground lines 20, one the one hand, and the second signal lines 30, on the other hand.

In the second embodiment, the ground lines 20a and the power lines 20b are formed at the same level. The second embodiment is therefore advantageous in two respects. First, the matching of the characteristic impedance of the first signal lines 10 and the second signal lines 30 can be attained at low cost. Second, the coupling capacitance between the first signal lines 10 and the second signal lines 30 can be minimized at low cost.

A multilayer wiring structure, the third embodiment of this invention, will now be described with reference to FIG. 9. The third embodiment is a four-layer wiring structure. It comprises a first signal-line layer 10, a second signal-line layer 30, a first power/ground line layer 20, and a second power/ground layer 40. It is characterized in that the first power/ground line layer 20 is located outside the first signal-line layer 10, and the second power/ground line layer 40 is located outside the second signal-line layer 30.

More specifically, as shown in FIG. 9, the first signal-line layer 10 consists of parallel strips and arranged in a first plane. The second signal-line layer 30 is arranged in a second plane parallel to the first plane and consists of parallel strips. The strips of the second signal-line layer 30 extend at right angels to those of the first signal-line layer 10 in a skewed position. The first power/ground line layer 20, which consists of parallel strips, is located outside the first signal-line layer 10. The strips of the layer 20 extend at 90° to the strips of the first signal-line layer 10 in a skewed position. The second power/ground line layer 40, which consists of parallel strips, is located outside the second signal-line layer 30. The strips of the layer 40 extend at 90° to those of the second signal-line layer 30 in a skewed position. The first power/ground line layer 20 is a combination of ground lines 20a and power lines 20b, which are arranged alternately. Similarly, the second power/ground line layer 40 is a combination of ground lines 40a and power lines 40b, which are arranged alternately. The lines 20a and 20b extend at 90° to the lines 40a and 40b in a skewed position.

The structure of FIG. 9 has three interlayer insulating films (not shown). The insulating films are interposed between the first signal-line layer 10 and the first power/ground line layer 20, between the first signal-line layer 10 and the second signal-line layer 30, and between the second signal-line layer 30 and the second power/ground line layer 40, respectively.

With the multilayer wiring structure shown in FIG. 9, it is possible to attain the matching of the characteristic impedance of the first signal-line layer 10 and the second signal-line layer 30. As a result of this, the signal-line layers 10, 30 are not much influence by the upper or lower layer thereof.

A multilayer wiring structure, which is the fourth embodiment of the present invention, will now be described with reference to FIG. 10. The fourth embodiment is a four-layer wiring structure, too. It comprises a first signal-line layer 10, a second signal-line layer 30, a first power/ground line layer 20, and a second power/ground layer 40. It is characterized in that the first power/ground line layer 20 is located inside the first signal-line layer 10, and the second power/ground line layer 40 is located inside the second signal-line layer 30.

As can be seen from FIG. 10, the first signal-line layer 10 consists of parallel strips and arranged in a first plane. The second signal-line layer 30 is arranged in a second plane parallel to the first plane and consists of parallel strips. The strips of the second signal-line layer 30 extend at right angels to those of the first signal-line layer 10 in a skewed position. The first power/ground line layer 20, which consists of parallel strips, is located inside the first signal-line layer 10. The strips of the layer 20 extend at 90° to the strips of the first signal-line layer 10 in a skewed position. The second power/ground line layer 40, which consists of parallel strips, is located inside the second signal-line layer 30. The strips of the layer 40 extend at 90° to those of the second signal-line layer 30 in a skewed position. The first power/ground line layer 20 is a combination of ground lines 20a and power lines 2b, which are arranged alternately. Similarly, the second power/ground line layer 40 is a combination of ground lines 40a and power lines 40b, which are arranged alternately. The lines 20a and 20b extend at 90° to the lines 40a and 40b in a skewed position.

The structure of FIG. 10 has three interlayer insulating films (not shown), too. The insulating films are interposed between the first signal-line layer 10 and the first power/ground line layer 20, between the first power/ground line layer 20 and the second power/ground line layer 40, and between the second power/ground line layer 40 and the second signal-line layer 30, respectively.

Also with the multilayer wiring structure shown in FIG. 10, the matching of the characteristic impedance of the first signal-line layer 10 and the second signal-line layer 30 can be accomplished.

A multilayer wiring structure, which is the fifth embodiment of the invention, will now be described with reference to FIG. 11. The fifth embodiment is a five-layer wiring structure. It comprises a first signal-line layer 10, a second signal-line layer 30, a first power/ground line layer 20 located below the layer 10, a second power/ground layer 40 located above the layer 30, and a third power/ground line layer 50 located between the layers 10 and 30. The fifth embodiment is identical to the second embodiment (FIGS. 8A and 8B), except that two additional components, i.e., the first power/ground line layer 20 and the second power/ground line layer 40 are arranged below the first signal-line layer 10 and above the second signal-line layer 30, respectively.

In the fifth embodiment, too, the strips of the first signal-line layer 10 extend at 90° to those of the second signal-line layer 30 in a skewed position. The strips of the power/ground line layers 20, 40 and 50 extend at 45° to the strips of both signal-line layers 10 and 30 in a skewed position.

The first power/ground line layer 20 is a combination of ground lines 20a and power lines 20b, which are arranged alternately. Similarly, the second power/ground line layer 40 is a combination of ground lines 40a and power lines 40b, which are arranged alternately. Also, the third power/ground line layer 50 is a combination of ground lines 50a and power lines 50b. The lines 20a and 20b extend at 90° to the liens 50a and 50b in a skewed position, which in turn extend at 90° to the lines 40a and 40b in a skewed position.

In the fifth embodiment, although the wiring capacitance of each signal-line strip is not so reduced as in the third and fourth embodiments, the coupling capacitance between the strips of the layer 10 and the strips of layer 30 can be decreased more greatly.

The second to fifth embodiments described above have two layers of signal lines. Nonetheless, the present invention can be applied to multilayer wiring structures which have three or more layers of signal lines.

The power/ground lines 2 may be connected at one end as is illustrated in FIG. 12A. Alternatively, the lines 2 may be connected at both ends as is shown in FIG. 12B. Furthermore, as shown in FIG. 12C, some of the power/ground lines 2, i.e., lines 2a, may be connected at one end and located, and the remaining power/ground lines 2b may be located among the lines 2a and connected at one end, so that the lines 2a and 2b having a different potential constitute an interleaved structure.

FIG. 12D shows another modification of the first embodiment (FIG. 3), which have power/ground lines 2a set at a first potential and power/ground lines 2b set at a second potential different from the first potential. All power/ground lines 2a and 2b are formed at the same level. The lines 2a are connected at both ends, forming a ladder-shaped electrode, whereas the lines 2b are arranged among the lines 2a and isolated from one another. The ladder-shaped electrode is connected to a power supply and is thereby set at the first potential. The power/ground lines 2b are connected to the other power/ground lines (not shown) located below the lines 2b, and are thereby set at the second potential.

Moreover, the power/ground lines 2 can be modified in shape, width and arrangement, if necessary, in order to attain matching of the characteristic impedance of the signal lines 1.

Figure 13:
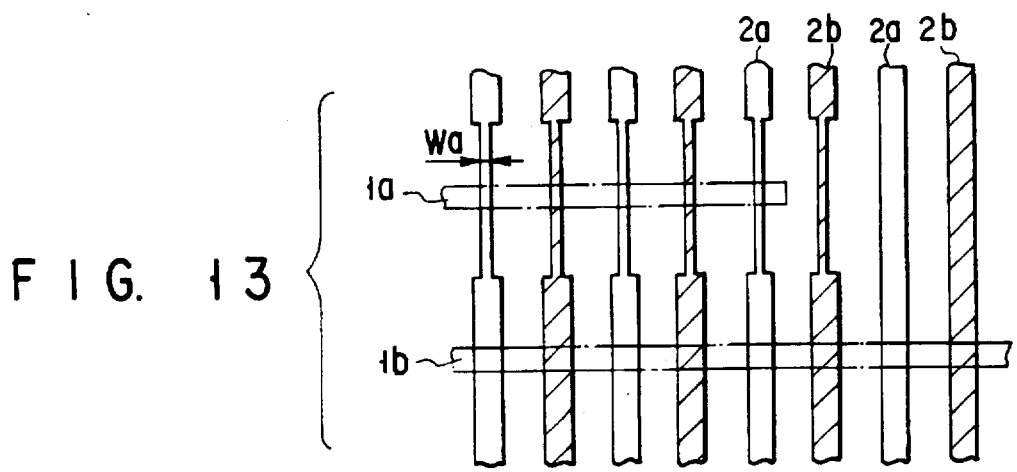
FIG. 13 is a plan view showing a modification of the first embodiment, wherein some of the power/ground lines have each a portion narrower than the other portions.

In some cases it is required to set most of the signal lines to a characteristic impedance and the other signal lines to a different characteristic impedance. To this end, some of first power/ground lines 2a and some of second power/ground lines 2b may each have one portion narrower than the other portions as is illustrated in FIG. 13, so that a signal line 1a interesting with the with the narrowed portions of the lines 2a and 2b has a characteristic impedance, whereas a signal line 1b intersecting with the wide portions of the lines 2a and 2b has a different characteristic impedance. Insulated from the power/ground lines 2a and 2b by an insulating film (not shown), the signal lines 1a and 1b can apply different characteristic impedances to the signals passing through them.

As can be understood from FIG. 13, the signal lines 1a and 1b have the same width the power/ground lines 2a set at the first potential have the width $W_a$, and the power/ground lines 2b set at the second potential have the width $W_b$. The width $W_b$ is greater than $W_a$, that is, $W_a < W_b$. Hence, the characteristic impedance $Z_a$ of the signal lines 2a is lower than the characteristic impedance $Z_b$ of the signal lines 2b; namely, $Z_a > Z_b$.

The relation between the characteristic impedances $Z_a$ and $Z_b$ may of course be reversed to $Z_a < Z_b$. This can be achieved merely by altering the relation between the widths $W_a$ and $W_b$ to $W_a > W_b$. In the structure of FIG. 13, some of the power/ground lines 2a and some of the power/ground lines 2b have only one narrow portion. If necessary, each of these lines 2a and 2b may have two or more narrowed portions which have different widths.

Figure 14A:
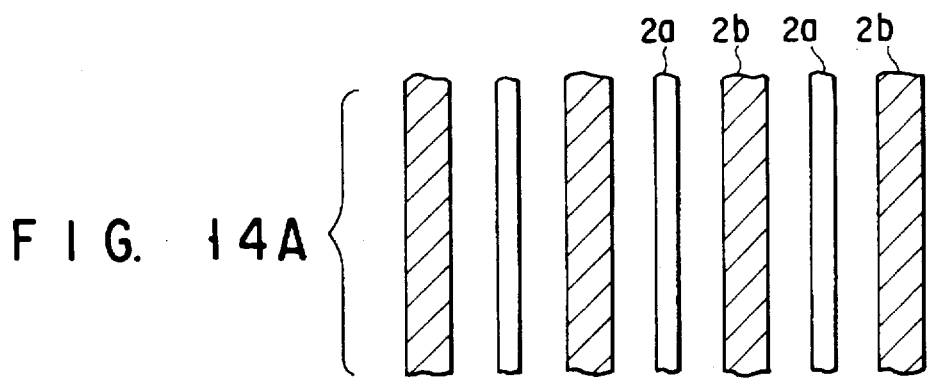
FIGS. 14A and 14B are each a plan view of a power/ground line layer which consists of power/ground lines having different widths.
Figure 14B:
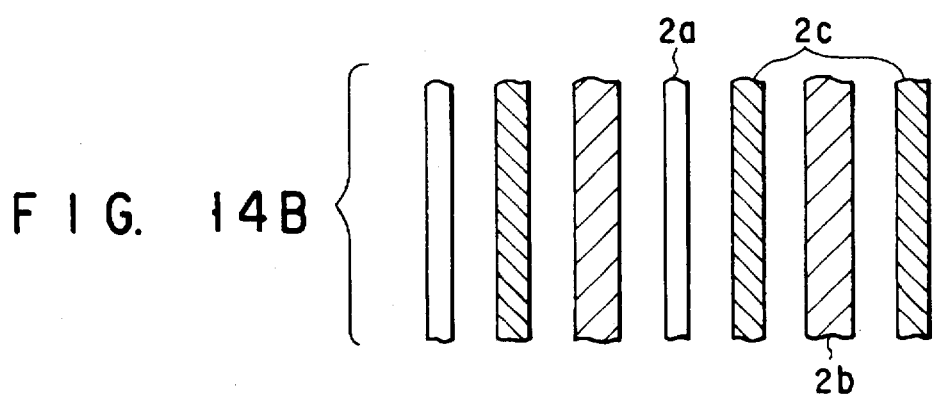

One of the advantages of the present invention resides in that power/ground lines set at different potentials can be formed in any power/ground layer. The power/ground lines at different potentials may have different widths. Then, the potentials of the power/ground lines can be visually recognized. This helps to reduce design errors and to facilitate visual inspection of the power/ground lines. FIGS. 14A and 14B show a power/ground layer each, which consists of power/ground lines having different widths.

The power/ground layer shown in FIG. 14A consists of two types of power/ground lines, i.e., lines 2a and lines 2b. The lines 2a have the same width, and the lines 2b have the same width greater than that of the lines 2a. As evident from FIG. 14A, the lines 2a and 2b are alternately arranged. Instead, each power/ground line of one type may be located next to every two power/ground lines of the other type. At any rate, the power/ground lines may be arranged in any order.

The power/ground layer shown in FIG. 14B consists of three types of power/ground lines, i.e., layers 2a, layers 2b, and 2c. The lines 2a have the same width; the lines 2b have the same width greater than that of the lines 2a; the lines 2c have the same width greater, than that of the lines 2b.

The power/ground lines shown in FIGS. 14A and 14B, which have different widths in accordance with their potentials, are useful particularly in the case where they must be locally arranged in an irregular pattern, not in a regular pattern.

In any embodiment described above, the signal lines are arranged in one layer, and the power/ground lines are formed in another layer at the different level. Nonetheless, signal lines and power/ground lines need to be formed at the same level, to constitute a special wiring structure, to transfer signals between line layers, or to achieve a similar objective.

Figure 15:
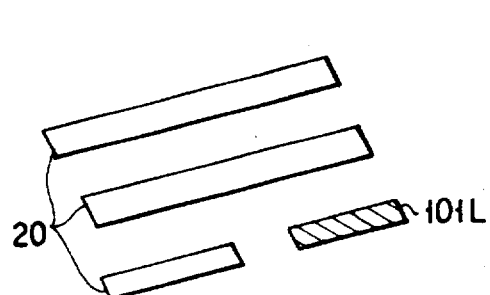
FIGS. 15 and 16 are plan views showing two modifications of a multilayer wiring structure according to the present invention.
Figure 16:
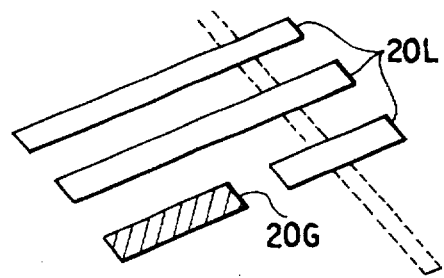

For example, as shown in FIG. 15, a signal line 10L may be arranged at the same level as the layer of power lines 20. Also, a power line 20G may be arranged at the same level as layer the layer of signal lines 20L, as shown in FIG. 16. Thus the signal-line layer partly can extend onto the power-line layer or ground-line layer, while maintaining its continuity. Conversely, a power line or a ground line may be arranged in a signal-line layer, while maintaining its continuity.

Figure 17A:
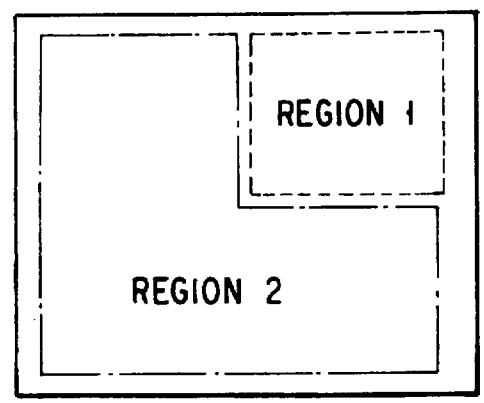
FIGS. 17A and 17B are plan views showing an embodiment of this invention, wherein two wiring modules are formed in two regions of a substrate.
Figure 17B:
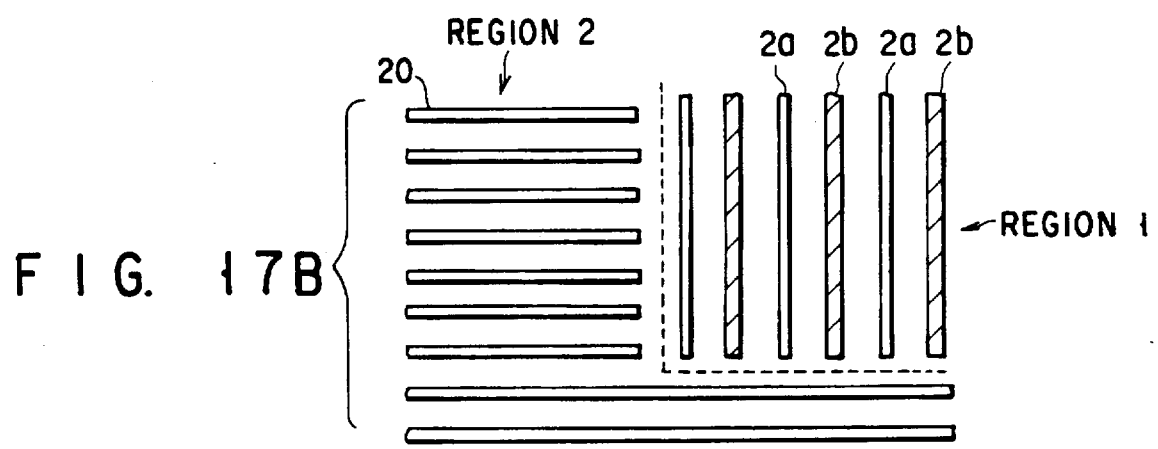
Figure 17C:
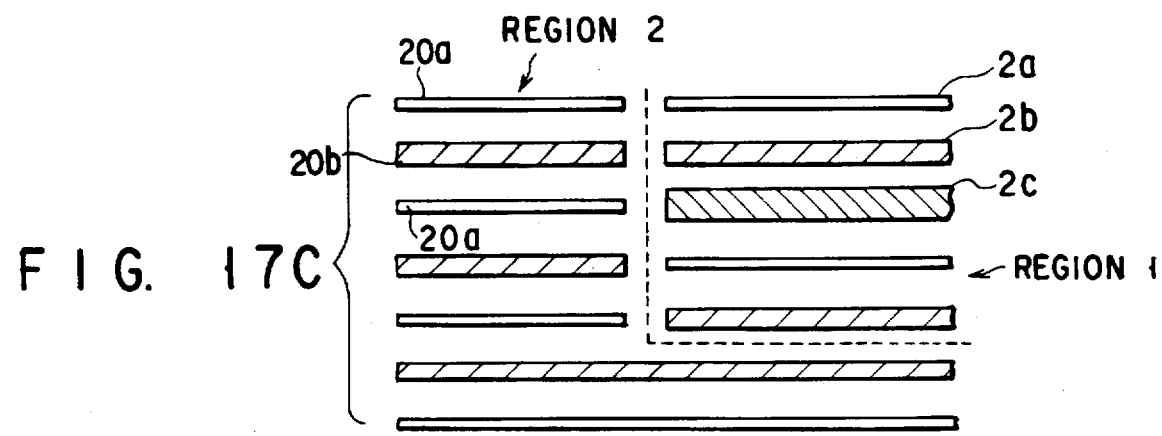
FIG. 17C is a plan view of a modification of the embodiment shown in FIGS. 17A and 17B.

With the present invention it is possible to form wiring for modules of different functions one substrate, as will be described with reference to FIGS. 17A, 17B and 17C. FIG. 17A a plan view showing two regions 1 and 2 on the substrate. FIG. 17B is a plan view of a power/ground line layer consisting of power/ground lines 2a, 2b and 2c arranged in region 1, and power/ground lines 20 arranged in region 2. FIG. 17C is also a plan view of a power/ground line layer consisting of power/ground lines 2a, 2b and 2c arranged in region 1, and power/ground lines 20a, 20b arranged in region 2.

In the power/ground line layer of FIG. 17B, the lines 2a and 2b extend at 90° to the lines 20 formed in the second region 2. The power/ground lines 2a and 2b can therefore be visually distinguished from the power/ground lines 20 arranged in the second region 2.

Needless to say, a signal-line layer at the level adjacent to the power/ground line layer may have a set of signal lines arranged in a first region 1, and may have another set of signal lines arranged in a second region 2 and extending at 90° to those arranged in the first region 1. The signal lines in the second region can, therefore, be visually distinguished from those arranged in the second region.

The power/ground line layer of FIG. 17C has two sets of power/ground lines. The power/ground lines 2a, 2b and 2c of the first set are arranged in the first region 1 and extend parallel to one another. The power/ground lines 20a and 20b of the second set are arranged in the second region 2 and parallel to one another. They are parallel to the lines of the first set, not extending at any angle to the lines of the first set. The lines arranged in either region have different widths. Therefore, any power line that is set at a specific potential can have a large current capacitance to allow the passage of a large current. For the same reason, where some lines with different potentials are connected with a ground line, a large width of the ground line can serve to increase the current capacitance of that ground line. In either region, the lines are spaced apart at regular intervals so that they can be designed to align with a grid. Instead, they may be spaced apart at irregular intervals.

In both the embodiments shown in FIGS. 17B and 17C, number of different potentials in the first region 1 is larger than that in the second region 2. Thus, the stripe patterns in the regions 1 and 2 are different. This makes it possible to suppress the noise emanating from the ground lines. Even if the stripe patterns differ in the number of potentials, they can be so designed as to remain continuous stripes.

Figure 18A:
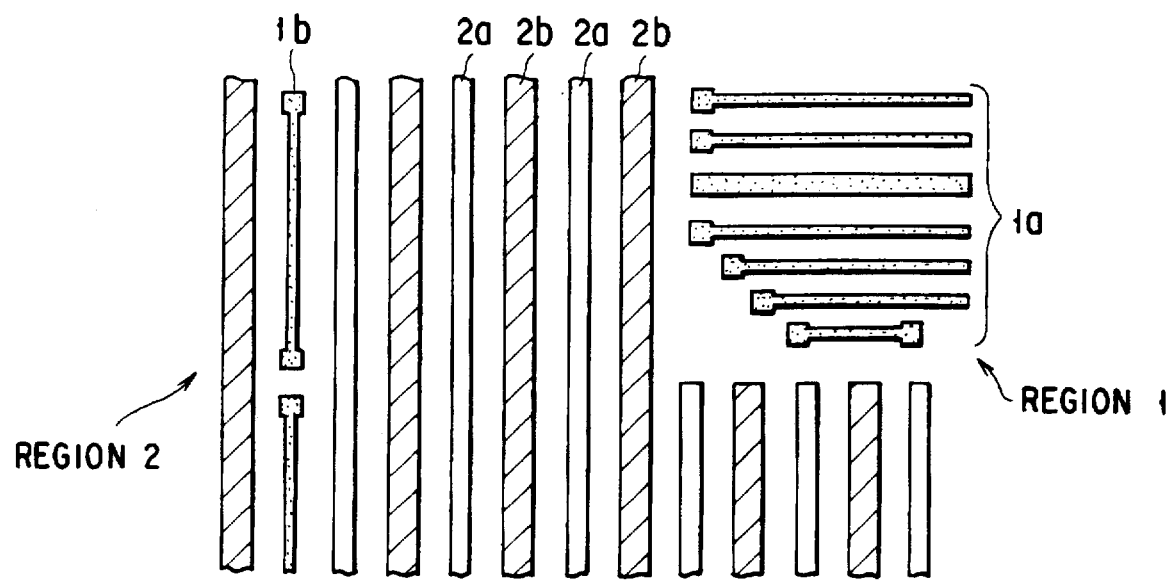
FIGS. 18A and 18B are a plan view and a sectional view, respectively showing two embodiments of the invention, wherein signal lines are arranged together with power/ground lines in the same region of a line layer.

The basic design of the line layer shown in FIG. 18A is that power/ground lines 2a and 2b are arranged in the second region 2, whereas signal lines 1a are arranged in the first region 1. However, two signal lines 1b are formed in the second region 2 and located between two adjacent power/ground lines 2b. Due to the presence of the signal lines 1b, the line layer can be designed without impairing the orderly stripe pattern. In this case, the space between the signal lines 1b and the power/ground lines 2a, 2b is different from that between the power/ground lines 2a and the power/ground lines 2b. As a result of this, the matching of the impedance of the signal lines 1b can be attained.

In the second region 1, no lines other than signal lines 1a are arranged. The signal lines 1a extend parallel to one another and at 90° to the power/ground lines 2a and 2b and the signal lines 1b—all arranged in the second region 2. They can therefore be distinguished from the lines arranged in the first region 1. They can of course extend at any other angle than 90° to the lines 2a and 2b and the signal lines 1b.

There are two reasons for arranging the signal lines 1b in the second region 2. The primary reason is that the first region 1 is too small to accommodate all signal lines. The secondary reason is that some signal lines need to be provided for repairing purpose. If any one of the signal lines 1a in the first region 1 is cut by accident, one of the signal lines 1b can be used so that the multilayer wiring structure may keep functioning. The larger the substrate, the lower the probability that all signal lines remain intact and complete. Hence, the number of signal lines provided for repairing purpose would influence the yield of a module comprising the multilayer wiring structure and many various electronic elements mounted on the wiring structure.

Figure 18B:
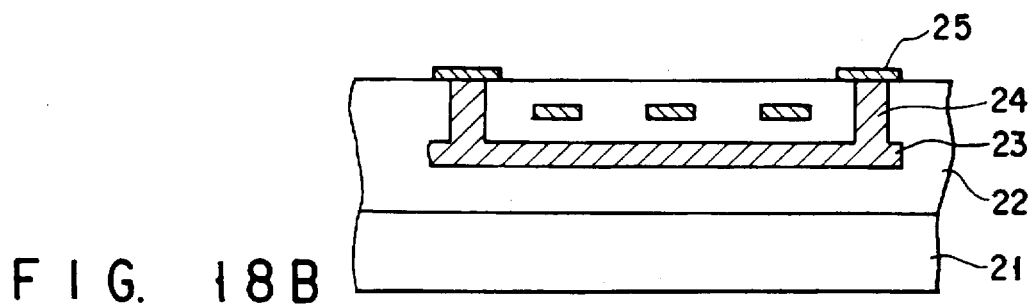

FIG. 18B is a cross sectional view of a multilayer wiring structure according to this invention, which has repairing signal lines. As shown in FIG. 18B, an interlayer insulating film 22 is formed on a substrate 21. The repairing signal lines 23 (only one shown) are embedded in the insulating film 22 and arranged at the same level as a power/ground line layer. Each signal line 22 is connected at both ends to a pad 25 by the conductors formed in via holes 24 made in the insulating film 22. If any signal line connecting an element to another is cut, electronic elements are wire-bonded to the pads which are connected by one of the repairing signal lines 23. Ultimately, the repairing signal lines 23 helps to enhance the yield of the modules mounted on the multilayer wiring structure. It is desirable that the wiring structure have as many repairing signal lines as possible, which extend in x- and Y-axis directions.

In manufacture of the thin-film multilayer wiring structures of the types described above, the structure must be examined, upon forming every line layer, for short-circuiting between any power line and any ground line of the line layer. Once the wiring structure has been manufactured, it is no longer possible to determine where short-circuiting, if detected, is occurring. Should a wiring structure, in which a power line and a ground line have been short-circuited, be subjected to all manufacturing steps, it would be waste of time and reduce the yield of the wiring structure.

Figure 19:
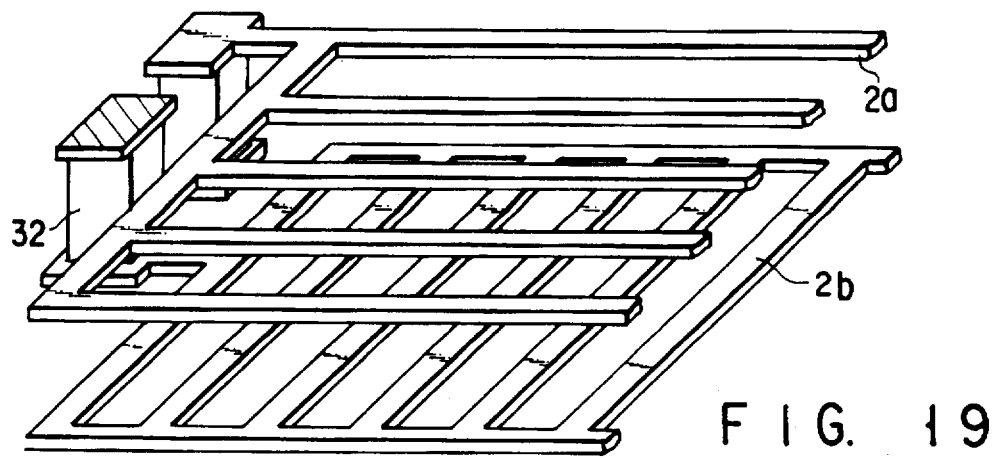
FIG. 19 is a perspective view illustrating a multi-layer wiring structure according to the invention, wherein each power/ground line layer has a probing pattern.

To determine whether any power line and any ground line are short-circuited or not, probing patterns 31a and 31b may be formed in a power-line layer 2a and a ground-line layer 2b, respectively, as is illustrated in FIG. 19. The probing patterns 31a and 31b can serve to measure the resistance between the power line and the ground line. Whether or not short-circuiting has occurred can be easily determined based on the resistance thus measured. The use of the probing patterns 31a and 31b ultimately shorten the time for manufacturing the multilayer wiring structure. In FIG. 19, numeral 32 designates via layers.

If different power-supply potentials need to be applied on the stripe patterns forming each of the line layers 2a and 2b, the short-circuiting test must be repeated as many times as the stripe patterns. In other words, whether or not short-circuiting has occurred between a power line and a ground line cannot be determined by conducting the test only once. In view of this, the power/ground line layers shown in FIGS. 12A to 12D, wherein the same potential is applied to many power/ground lines, are more advantageous.

Figure 20:
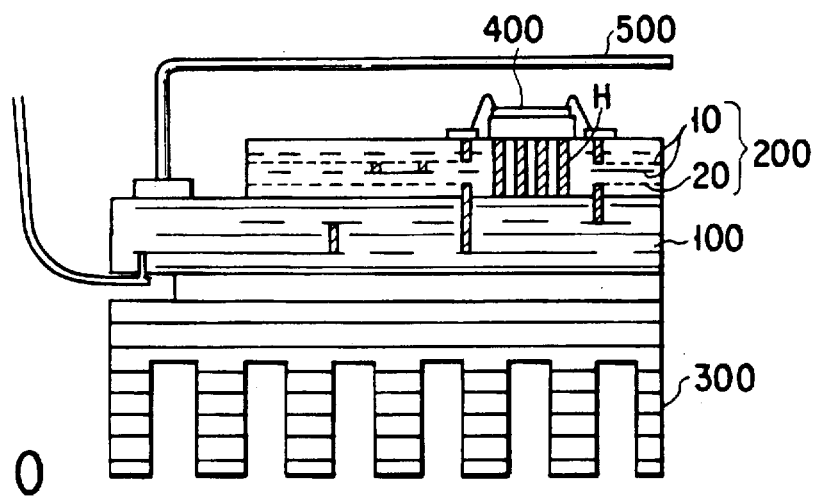
FIG. 20 a cross-sectional view of a multi-chip module incorporating a multilayer wiring structure according to the present invention.

The multilayer wiring structures according to this invention can be effectively applied to a multi-chip module of the type shown in FIG. 20. As is shown in FIG. 20, the multi-chip module comprises a multilayer wiring substrate 100, a thin-film multilayer wiring section 200 formed on the upper surface of the substrate 100, LSI chips 400 (only one shown) mounted on the wiring section 200, heat-radiating fin 300s attached to the lower surface of the wiring substrate 100, and a cap 500 covering the section 200 and the LSI chips 400.

The heat the LSI chip 400 generates propagates through the thermal via H made in the thin-film wiring section 200 and the multilayer wiring substrate 100. Then, the heat is efficiently radiated into the atmosphere from the heat-radiating fins 300 attached to the lower surface of the substrate 100.

The thin-film multilayer wiring section 200 have signal lines 10 and power/ground lines 20. The power/ground lines 20 extend at right angles to the signal lines 10 in a skewed position, just in the same manner as in the multilayer wiring structure illustrated in FIG. 11. If the signal lines connecting the LSI chips 400 are formed mainly in the thin-film wiring section 200, the multi-chip module, which has low-capacitance lines and is suitable for signal processing at high speed, can be realized.

Figure 21A:
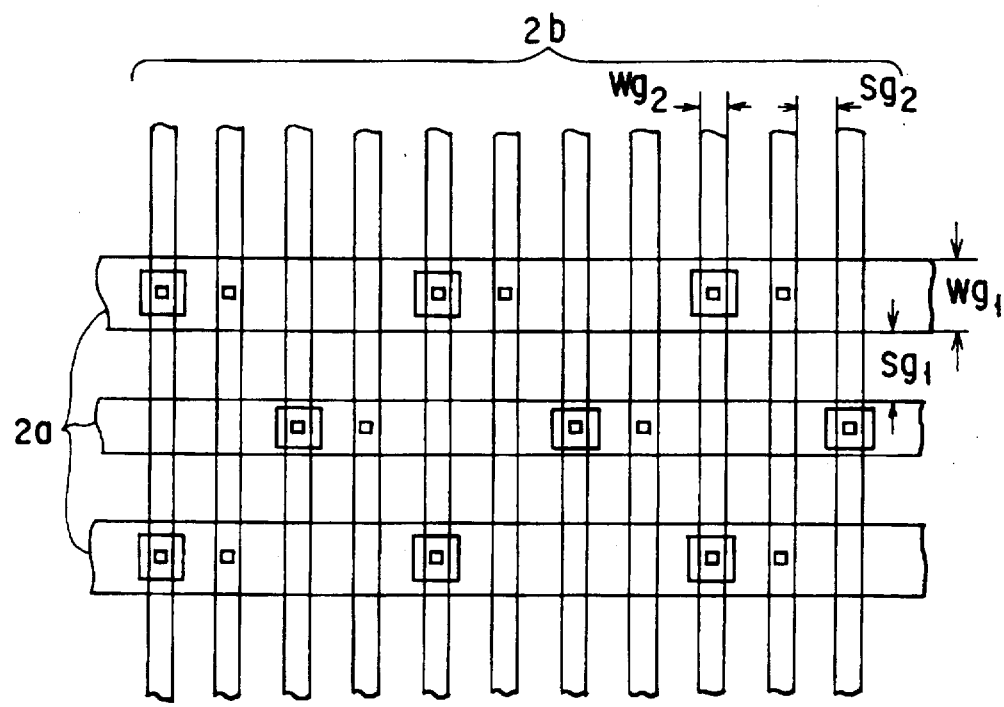
FIGS. 21A and 21B are a plan view and a sectional view, both showing an embodiment of the invention, wherein one power/ground line layer differs from the other power/ground line in terms of line width and line pitch.
Figure 21B:
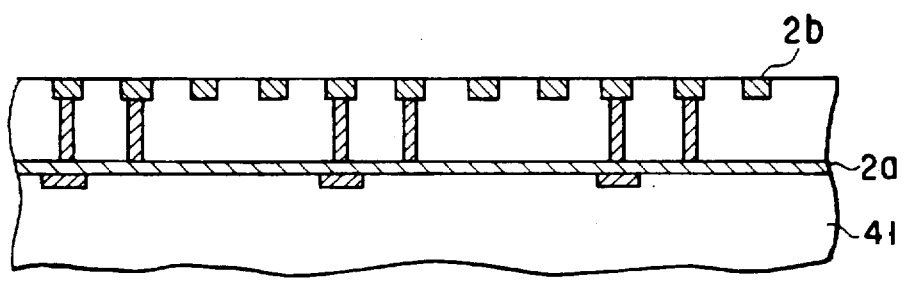

In a multilayer wiring structure having many power/ground line layers, each line layer may differ from any other line layer in terms of width and pitch of lines. FIGS. 21A and 21B are a plan view and a sectional view, showing a multilayer wiring structure of this type which is designed for use in such a multi-chip module as is illustrated in FIG. 20.

As shown in FIG. 21B, this multilayer wiring structure comprises a ceramic substrate 41, a first power/ground line layer 2a formed on the substrate 41, a signal-line layer (not shown) located above the layer 2a, and a second power/ground line layer 2b located above the signal-line layer.

As is seen from FIG. 21A, the lines of the first power/ground line layer 2a have a width $Wg_1$ and are spaced apart at pitch $Sg_1$, and the lines of the second power/ground line layer 2b have a width $Wg_2$ and are spaced apart at pitch $Sg_2$. Width $Wg_1$ is greater than width $wg_2$, and pitch $Sg_1$ is greater than pitch $Sg_2$. That is: $Wg_1 > Wg_2$, $Sg_1 > Sg_2$.

In the case of the multilayer wiring structure shown in FIGS. 21A and 21B, power is supplied from the I/O section (not shown) formed in the ceramic substrate 41 to the power/ground line layer (not shown) formed in the ceramic substrate 41. The power is supplied hence to the first power/ground layer 2a through the power-supplying section 42 formed in the surface of the substrate 41. Further, it is supplied to the second power/ground line layer 2b. Finally, the power is supplied to the electronic elements mounted on the multilayer wiring structure.

Since $Wg_1 > Wg_2$, $Sg_1 > Sg_2$, even if the power is supplied to a thin-film wiring section having lines arranged at a short pitch from the power-supplying section 42 which has lines arranged at a long pitch, the line pitch of the section 42 need not be changed, and a regular design can be performed. And the power can be supplied to the elements at more points.

Figure 22:
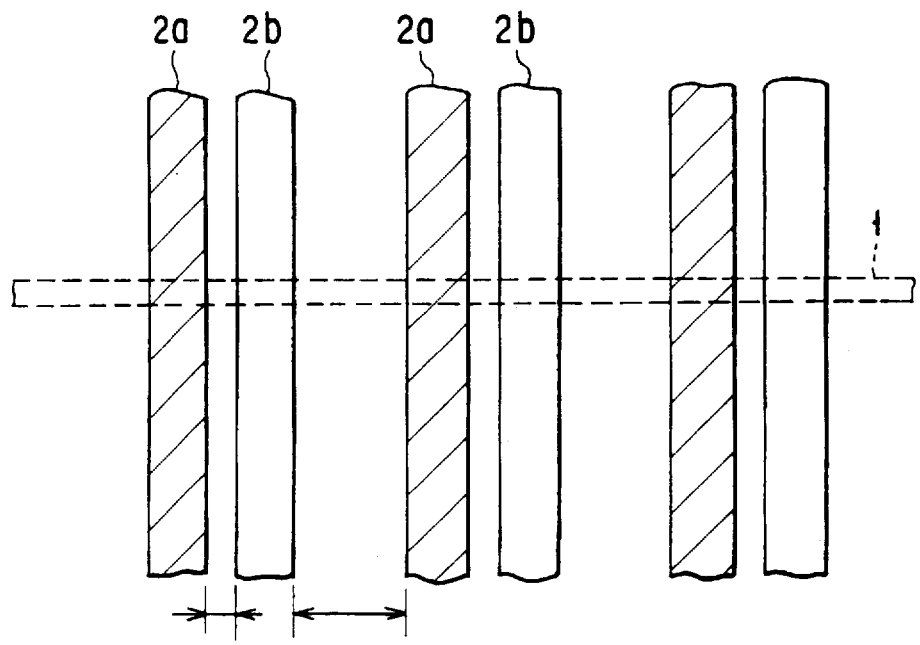
FIG. 22 is a plan view of a line layer consisting of power lines set at a potential and ground lines set at a different potential.

FIG. 22 is a plan view showing a line layer which consists of power lines 2a and ground lines 2b, which are arranged at the same level. The power lines 2a are set a potential, and the ground lines 2b at a different potential. Each power line 2a makes a pair with one ground line 2a. The lines 2a and 2b of the pair are spaced part by a distance $S_1$. Distance $S_1$ is long enough to electrically isolate the power line 2a and the ground line 2b from each other. Each pair of lines is spaced apart from either adjacent pair by a distance $S_2$ which is longer than distance $S_1$. Therefore, each power line 2a has a relatively low impedance, and the signal line 1 has a small capacitance.

In the power/ground line layer of FIG. 22, the power lines 2a may have a width different from that of the ground lines 2b, so as to be visually distinguished from the ground lines 2b. In this case, the potential of whichever line can be easily recognized even if the lines 2a and 2a are arranged in a different order from the one shown in FIG. 22.

In the conventional multilayer wiring structure, the interlayer insulating films are made thicker or the power-line layer is shaped like net, in order to decrease the capacitance of the signal lines. If the capacitance of the signal lines are reduced by either method, however, the coupling capacitance between a power line and a ground line will decrease inevitably because the power/ground lines of the same layer are set at the same potential. It is therefore difficult with the conventional wiring structure to reduce the impedance of each power line.

In the power/ground layer of in FIG. 22, the power lines 2a are set at a potential, while the ground lines 2b at a different potential. Thus, the coupling capacitance between each power line 2a and an adjacent ground line 2b can be increased only if one power line 2a and one ground line 2b are juxtaposed, forming a pair of lines, but are spaced apart by a distance long enough to be electrically isolated from each other. It is therefore possible not only to decrease the impedance of each power line, but also to reduce the capacitance of each signal line.

Multilayer wiring structures according to this invention can be used in an LSI device shown in FIG. 23 or in an LSI device shown in FIG. 24. The LSI device of FIG. 23 incorporates a multilayer wiring structure which has two power/ground line layers and two signal-line layers. The LSI device of FIG. 24 incorporates a multilayer wiring structure which has one power/ground line layer and two signal-line layers.

In the LSI device shown in FIG. 23, an interlayer insulating film 52 is formed on a silicon substrate 51, and the first power/ground line layer 53a, the first signal-line layer 54a, the second signal-line layer 54b, and the second power/ground line layer 53b are formed in the interlayer insulating film 52. The first signal-line layer 54a is located above the first power/ground line layer 53a; the second signal-line layer 54b above the first signal-line layer 54a; and the second power/ground line layer 53b above the second signal-line layer 54b. The first signal-line layer 54a is connected to the gate electrodes formed on the substrate 51, whereas the second power/ground line layer 53b is connected to the diffusion regions 65 formed in the surface of the substrate 51. Element-isolating films 75 are formed in the surface of the substrate 51.

In the LSI device of FIG. 24, an interlayer insulating film 62 is formed on the element region of an n-type silicon substrate 61. The first signal-line layer 63a, the power/ground line layer 64, and the second signal-line layer 63b are formed in the interlayer insulating film 62. The power/ground line layer 64 is located above the first signal-line layer 63a, and the second signal-line layer 63b is positioned above the power/ground line layer 64. The power/ground line layer 64 consists of first power/ground lines set at a first potential and second power/ground lines set at a second potential. Two additional signal-line layers may be located above the element region of the substrate 61, and one additional power/ground line layer may be positioned above the upper additional signal-line layer.

Figure 25:
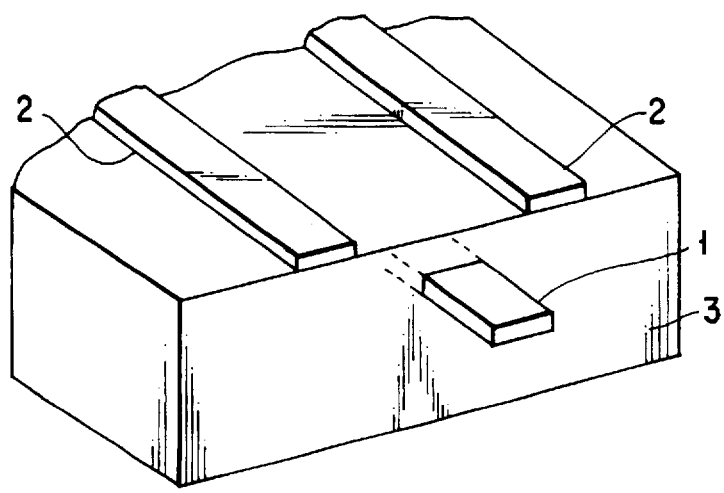
FIG. 25 is a perspective view of a multilayer wiring structure according to still another embodiment of this invention.

The present invention is not limited to the embodiments described above, wherein the signal lines are located in a skewed position with respect to the power/ground lines. The invention can be applied to the multilayer wiring structure shown in FIG. 25, in which the parallel power/ground lines 2 extend parallel to the signal lines 1.

As has been described, the present invention can provide multilayer wiring structures which can be used to connect high-speed electronic elements and which has a high packing density and high reliability.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A multilayer wiring structure comprising:
   a substrate;
   a first line layer essentially consisting of at least one of a strip-shaped power line and a strip-shaped ground line extending in a first direction;
   a second line layer located above or below said first line layer and essentially consisting of at least one strip-shaped signal line extending in a second direction; and
   an interlayer insulating layer interposed between said first line layer and said second line layer, said first direction being in a skewed position with respect to said second direction.

2. The multilayer wiring structure according to claim 1, wherein said first direction extends at 90° to said second direction in a skewed position.

3. The multilayer wiring structure according to claim 1, wherein said first line layer comprises plural of said strip-shaped lines having a width $W_{pg}$ and arranged at intervals $S_{pg}$, said width $W_{pg}$ being equal to or less than said intervals $S_{pg}$.

4. The multilayer wiring structure according to claim 1, wherein said at first line layer comprises a strip-shaped power line and a strip-shaped ground line which are located in the same level.

5. The multilayer wiring structure according to claim 4, comprising plural alternately arranged of said power and ground lines.

6. The multilayer wiring structure according to claim 1, wherein said first line layer consists of a plurality of power lines which are connected at one end.

7. The multilayer wiring structure according to claim 1, wherein said first line layer consists of a plurality of power lines which are connected at both ends.

8. The multilayer wiring structure according to claim 1, wherein said first line layer consists of a plurality of ground lines which are connected at one end.

9. The multilayer wiring structure according to claim 1, wherein said first line layer consists of a plurality of ground lines which are connected at both ends.

10. A multilayer wiring structure comprising:

a substrate;

a first line layer essentially consisting of at least one of a strip-shaped power line and a strip-shaped ground line extending in a first direction;

a second line layer located above or below said first line layer and essentially consisting of at least one strip-shaped signal line extending in a second direction;

an interlayer insulating layer interposed between said first line layer and said second line layer, said first direction being in a skewed position with respect to said second direction; and wherein said at least one of the strip-shaped power line and the strip-shaped ground line of said first line layer have a width $W_{pg}$ and the at least one strip-shaped signal line of said second line layer has a width $W_s$, said width $W_s$ being equal to or less than said width $W_{pg}$.

11. A multilayer wiring structure comprising:

a substrate;

a first line layer essentially consisting of at least one of a strip-shaped power line and a strip-shaped ground line extending in a first direction;

a second line layer located above or below said first line layer and essentially consisting of at least one strip-shaped signal line extending in a second direction;

an interlayer insulating layer interposed between said first line layer and said second line layer, said first direction being in a skewed position with respect to said second direction; and a third line layer arranged at a different level from said second line layer and essentially consisting of at least one strip-shaped signal line and in which said first line layer is located between said second line layer and said third line layer.

12. A multilayer wiring structure comprising:

a substrate;

a first line layer essentially consisting of at least one of a strip-shaped power line and a strip-shaped ground line extending in a first direction;

a second line layer located above or below said first line layer and essentially consisting of at least one strip-shaped signal line extending in a second direction;

an interlayer insulating layer interposed between said first line layer and said second line layer, said first direction being in a skewed position with respect to said second direction;

a third line layer arranged at a level adjacent to said second line layer and essentially consisting of at least one strip-shaped signal line; and a fourth line layer arranged at another level adjacent to said third line layer and essentially consisting of at least one of a power line and a ground line.

13. The multilayer wiring structure according to claim 12, wherein the strip-shaped signal line of said second line layer extends at about 90° to the strip-shaped signal line of said third line layer in a skewed position, and the at least one of the power line and ground line of said first line layer extends at about 90° to the at least one of the power line and the ground line of said fourth line layer in a skewed position.

14. A multilayer wiring structure comprising:

a substrate;

a first line layer essentially consisting of at least one of a strip-shaped power line and a strip-shaped ground line extending in a first direction;

a second line layer located above or below said first line layer and essentially consisting of at least one strip-shaped signal line extending in a second direction;

an interlayer insulating layer interposed between said first line layer and said second line layer, said first direction being in a skewed position with respect to said second direction;

a third line layer arranged at a level adjacent to said second line layer and essentially consisting of at least one of a power line and a ground line;

a fourth line layer arranged at a level adjacent to said third line layer and including a signal line; and a fifth line layer arranged at a level adjacent to said fourth line layer and essentially consisting of at least one strip-shaped signal line.

15. A multilayer wiring structure comprising:

a substrate;

a first line layer essentially consisting of at least one of a strip-shaped power line and a strip-shaped ground line extending in a first direction;

a second line layer located above or below said first line layer and essentially consisting of at least one strip-shaped signal line extending in a second direction;

an interlayer insulating layer interposed between said first line layer and said second line layer, said first direction being in a skewed position with respect to said second direction; and wherein said first line layer includes lines having different widths.

16. A multilayer wiring structure comprising:

a substrate;

a first line layer essentially consisting of at least one of a strip-shaped power line and a strip-shaped ground line extending in a first direction;

a second line layer located above or below said first line layer and essentially consisting of at least one strip-shaped signal line extending in a second direction;

an interlayer insulating layer interposed between said first line layer and said second line layer, said first direction being in a skewed position with respect to said second direction; and wherein said first line layer includes a first strip having a width and set at a potential and a second strip having a different width and set at a different potential.

17. A semiconductor device comprising:

a semiconductor substrate having a major surface;

a semiconductor element formed in the major surface of said semiconductor substrate;

a multilayer wiring structure located above said semiconductor element; and a first interlayer insulating layer interposed between said semiconductor element and said multilayer wiring structure, said multilayer wiring structure comprising:

a first line layer essentially consisting of at least one of a strip-shaped power line and a strip-shaped ground line extending in a first direction, a second line layer located above or below said first line layer and essentially consisting of at least one strip-shaped signal line extending in a second direction, and a second interlayer insulating layer interposed between said first line layer and said second line layer, said first direction being in a skewed position with respect to said second direction.

18. A semiconductor device comprising:

a semiconductor substrate having a major surface;

a semiconductor element formed in the major surface of said semiconductor substrate;

a multilayer wiring structure located above said semiconductor element; and a first interlayer insulating layer interposed between said semiconductor element and said multilayer wiring structure, said multilayer wiring structure comprising:

a substrate, a first line layer essentially consisting of at least one of a strip-shaped power line and a strip-shaped ground line extending in a first direction, a second line layer located above or below said first line layer and essentially consisting of at least one strip-shaped signal line extending in a second direction, and a second interlayer insulating layer interposed between said first line layer and said second line layer, said first direction being in parallel with said second direction.

* * * * *